United States Patent
Berggren et al.

(10) Patent No.: US 10,581,464 B2
(45) Date of Patent: Mar. 3, 2020

(54) ENCODER DEVICE, DECODER DEVICE, AND METHODS THEREOF

(71) Applicant: Huawei Technologies Co., Ltd., Shenzhen (CN)

(72) Inventors: Fredrik Berggren, Kista (SE); Alberto Giuseppe Perotti, Segrate (IT)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 6 days.

(21) Appl. No.: 15/934,361

(22) Filed: Mar. 23, 2018

(65) Prior Publication Data
US 2018/0212630 A1  Jul. 26, 2018

Related U.S. Application Data

(63) Continuation of application No. PCT/EP2015/071957, filed on Sep. 24, 2015.

(51) Int. Cl.
*H03M 13/39* (2006.01)
*H03M 13/00* (2006.01)
(Continued)

(52) U.S. Cl.
CPC ....... *H03M 13/3988* (2013.01); *H03M 13/23* (2013.01); *H03M 13/235* (2013.01);
(Continued)

(58) Field of Classification Search
CPC .............................................. H03M 13/3988
(Continued)

(56) References Cited

U.S. PATENT DOCUMENTS

2008/0250303 A1* 10/2008 Chae ................. H03M 13/4107
714/795
2010/0095189 A1    4/2010 Park et al.
(Continued)

FOREIGN PATENT DOCUMENTS

CN    102638277 A    8/2012
CN    102742205 A    10/2012
(Continued)

OTHER PUBLICATIONS

Howard et al.,"On Tail Biting Convolutional Codes," IEEE Transactions on Communications, XP2038443A, vol. Com-34, No. 2,Feb. 1986, 8 pages.

*Primary Examiner* — Fritz Alphonse
(74) *Attorney, Agent, or Firm* — Slater Matsil, LLP

(57) ABSTRACT

An embodiment encoder device for encoding an information word $c=[c_0, c_1, \ldots, c_{K-1}]$ having K information bits, $c_i$, includes an encoder for a tail biting convolutional code having a constraint length, L, where $K<L-1$; the encoder being configured to receive the K information bits; and encode the K information bits so as to provide an encoded code word. An embodiment decoder device for determining an information word $c=[c_0, c_1, \ldots, c_{K-1}]$, having K information bits, $c_i$, includes a decoder for a tail biting convolutional code having a constraint length, L, where $K<L-1$; the decoder being configured to: receive an input sequence; compute at least one reliability parameter based on the received input sequence; and determine an information word c based on the at least one reliability parameter.

19 Claims, 4 Drawing Sheets

(51) Int. Cl.
  *H04L 1/00*     (2006.01)
  *H03M 13/23*    (2006.01)
  *H03M 13/41*    (2006.01)
  *H04L 1/18*     (2006.01)

(52) U.S. Cl.
  CPC ..... *H03M 13/3994* (2013.01); *H03M 13/413* (2013.01); *H03M 13/6525* (2013.01); *H04L 1/0041* (2013.01); *H04L 1/0059* (2013.01); *H04L 1/0073* (2013.01); *H04L 1/00* (2013.01); *H04L 1/1861* (2013.01)

(58) Field of Classification Search
  USPC .................................................. 714/699, 703
  See application file for complete search history.

(56) References Cited

U.S. PATENT DOCUMENTS

| | | | |
|---|---|---|---|
| 2012/0320951 A1* | 12/2012 | Han | H04L 1/0041 375/141 |
| 2016/0352362 A1* | 12/2016 | Fonseka | H03M 13/2906 |
| 2016/0352419 A1* | 12/2016 | Fonseka | H04B 10/0793 |
| 2017/0164347 A1 | 6/2017 | Han et al. | |
| 2018/0132230 A1 | 5/2018 | Han et al. | |
| 2018/0294922 A1* | 10/2018 | Li | H04L 1/0071 |

FOREIGN PATENT DOCUMENTS

| | | |
|---|---|---|
| CN | 102823213 A | 12/2012 |
| CN | 104796160 A | 7/2015 |
| EP | 2533451 A2 | 12/2012 |

\* cited by examiner

104

US 10,581,464 B2

ENCODER DEVICE, DECODER DEVICE, AND METHODS THEREOF

CROSS-REFERENCE TO RELATED APPLICATIONS

This application is a continuation of International Application No. PCT/EP2015/071957, filed on Sep. 24, 2015, the disclosure of which is hereby incorporated by reference in its entirety.

TECHNICAL FIELD

The present application relates to a device for encoding (also known as an encoder device in this disclosure) and a device for determining an information word (also known as a decoder device in this disclosure). Furthermore, the present application also relates to corresponding methods, a wireless communication system, a computer program, and a computer program product.

BACKGROUND

Downlink carrier aggregation is a method to increase the throughput in a cellular communications system by configuring the receiver with multiple component carriers, over which data may be received simultaneously. To facilitate carrier aggregation, the receiver needs to send Uplink Control Information (UCI) to the base station. This may comprise Hybrid Automatic Repeat request (HARQ) Acknowledgement (HARQ-ACK) bits in response to received Transport Blocks (TBs), periodic/aperiodic Channel State Information (CSI) reports and Scheduling Request (SR). Generally, the more carriers that are aggregated, the more UCI is needed. The reliability of the UCI is critical to both the system efficiency and the coverage and often comes with certain performance requirements. For example, there are stringent performance requirements for the ACK-to-NACK and NACK-to-ACK error probabilities which need to be fulfilled. It is therefore important that UCI can be transmitted reliably In Long Term Evolution (LTE) Rel-13, carrier aggregation has been enhanced to allow aggregation of up to 32 downlink component carriers, which is in contrast to the maximum of 5 component carriers being supported so far. This not only increases the associated maximum UCI payload but also induces larger variation of the UCI payload. For example, only a few HARQ-ACK bits need to be fed back when there are few carriers aggregated. Up to two TBs may be transmitted in a subframe on a downlink component carrier and each TB is associated with one HARQ-ACK bit. Thus, the minimum HARQ-ACK payload could be 2 bits, corresponding to 2 aggregated Frequency Division Duplex (FDD) component carriers carrying 1 TB each. On the other hand, the maximum HARQ-ACK payload could theoretically reach as high as 638 bits for Time Division Duplex (TDD) with aggregation of 32 component carriers. Also the CSI payloads could vary from a few bits to several hundred of bits. Consequently, it is preferable to have a channel coding scheme for the UCI which gives reasonable performance for a variety of UCI payload sizes while allowing simple encoder and decoder structures.

For small UCI payloads, the 3rd Generation Partnership Project (3GPP) LTE-Advanced system is using various types of block codes, e.g., Reed-Muller codes are used for up to 23 HARQ-ACK/SR bits. However, these codes cannot easily be generalized to the potential large payloads that come with aggregation of up to 32 carriers.

SUMMARY

An objective of embodiments of the present application is to provide a solution which mitigates or solves the drawbacks and problems of conventional solutions.

Another objective of embodiments of the present application is to provide devices and methods for encoding information words having few bits with high reliability while enabling simple decoding procedures.

An "or" in this description and the corresponding claims is to be understood as a mathematical OR which covers "and" and "or", and is not to be understood as an XOR (exclusive OR).

The above objectives and further objectives are achieved by the subject matter of the independent claims. Further advantageous implementation forms of the present application are found in the dependent claims.

According to a first aspect of the application, the above mentioned and other objectives are achieved with a device for encoding an information word $c=[c_0, c_1, \ldots, c_{K-1}]$ having K information bits, $c_i$, the device comprising an encoder comprising a tail biting convolutional code having a constraint length, L, where $K<L-1$; the encoder being configured to receive the K information bits and encode the K information bits so as to provide an encoded code word.

A number of advantages are provided by a device according to the first aspect.

The present solution allows using a tail biting convolutional code also for small number of information bits, and can therefore simplify the encoder (e.g. in a transmitter) and decoder (e.g. in a receiver) by obviating the need for additional channel codes, e.g., block codes. Further, the present solution makes it possible to encode information words consisting of K bits with a tail biting convolutional code having a constraint length L, where $K<L-1$.

In a first possible implementation form of a device according to the first aspect, the encoder comprises an initial state of bit values and a final state of bit values used in the encoding of the K information bits, and wherein the initial state of bit values is the same the final state of bit values.

The states in the encoder relate to bit values that are used for computing the encoded bits, e.g., the states may be represented in certain implementations by the values in shift registers. An initial state of bits values could be the shift register content prior to receiving the information word in the encoder, while the final state of bit values could be the shift register content after receiving the information word in the encoder.

The first possible implementation form allows an encoding procedure without rate loss due to avoiding padding the information word with bits having the value zero in order to let the initial and final state of bit values in the encoder be zero.

In a second possible implementation form of a device according to the first possible implementation form of the first aspect or to the first aspect as such, the encoder further is configured to append at least one bit to the information word c so as to obtaining an appended information word $c'=[c'_0, c'_1, \ldots, c'_{K'-1}]$ having $K' \geq L-1$ bits, and using the appended information word c' as the initial state of bit values.

The appending of the at least one bit could include inserting the appended bit(s) before, after or between the bits in the information word depending on the application. As realized also more than one bit may be appended to fulfil the condition that K'≥L−1.

The second possible implementation form allows an encoding procedure without rate loss due to avoiding padding the information words with bits having the value zero in order to let the initial and final state of bit values in the encoder be zero.

In a third possible implementation form of a device according to the second possible implementation form of the first aspect, the at least one appended bit has a predetermined value.

The third possible implementation form has an advantage in that the predetermined value could be utilized to improve the performance in the decoder.

In a fourth possible implementation form of a device according to the third possible implementation form of the first aspect, the at least one appended bit has a predetermined fixed position.

The fourth possible implementation form has an advantage in that the predetermined fixed position could be utilized to improve the performance in the decoder.

In a fifth possible implementation form of a device according to the third or fourth possible implementation form of the first aspect, the encoder further is configured to append L−1−K fixed bits $f_0, \ldots, f_{L-2-K}$ according to $$c'_{\pi_k} = \begin{cases} c_k, & k = 0, \ldots, K-1 \\ f_{k-K}, & k = K, \ldots, L-2 \end{cases}$$

where $\pi = [\pi_0, \ldots, \pi_{L-2}]$ is a permutation of integers $[0, \ldots, L-2]$.

The fifth possible implementation form has an advantage that a tail biting convolutional code decoder which is applicable to the case of K≥L−1, also could be utilized in the case of K<L−1, which reduces the complexity of a receiver comprising the decoder.

In a sixth possible implementation form of a device according to any of the third to fifth possible implementation forms of the first aspect, the device is configured to input the appended information word c' to the encoder so as to encode the K information bits.

The sixth possible implementation form has an advantage that a tail biting convolutional code decoder which is applicable to the case K≥L−1, also could be utilized in the case K<L−1, which reduces the complexity of a receiver comprising the decoder.

In a seventh possible implementation form of a device according to the second possible implementation form of the first aspect, the at least one appended bit is obtained from a cyclic extension of the information word c.

The seventh possible implementation form has an advantage that there is no coding rate loss, since the number of input bits to the encoder is K, i.e. equal to the number of bits of the information word.

In an eighth possible implementation form of a device according to the seventh possible implementation form of the first aspect, the initial state of bit values are $$s_i = c_{(K-1-i) \bmod K}, \ i = 0, \ldots, L-1$$

where (K−1−i)mod K is smallest nonnegative integer that can be written as (K−1−i)+pK for an integer p.

The eighth possible implementation form has an advantage that the initial state of bit values could be utilized to improve the performance in the decoder.

In a ninth possible implementation form of a device according to the seventh or eighth possible implementation form of the first aspect, the device further is configured to input the information word c to the encoder so as to encode the K information bits.

The ninth possible implementation form has an advantage that a tail biting convolutional code decoder which is applicable to the case K≥L−1, also could be utilized in the case K<L−1, which reduces the complexity of a receiver comprising the decoder.

In a tenth possible implementation form of a device according to any of the first to ninth possible implementation form of the first aspect, the encoder comprises a shift register of length L−1, where K<L−1, for encoding the K information bits; and wherein the initial state of the bit values in the shift register (104), $s = [s_0, s_1, \ldots, s_{L-2}]$, is the same as the final state of the bit values in the shift register (104).

The tenth possible implementation form has the advantage of low-complexity encoding by utilizing shift registers, while enabling tail biting in the encoding.

In a eleventh possible implementation form of a device according to any of the preceding possible implementation forms of the first aspect or to the first aspect as such, generator polynomials of the encoder are G0=133, G1=171 and G2=165 in octal representation, and wherein L=7.

The eleventh possible implementation form has the advantage of using the tail biting convolutional code defined for the 3GPP E-UTRA (LTE) system.

In a twelfth possible implementation form of a device according to any of the preceding possible implementation forms of the first aspect or to the first aspect as such, the information word $c = [c_0, c_1, \ldots, c_{K-1}]$ is at least one of control information, data information, cyclic redundancy check bits, and padding bits.

The twelfth possible implementation form has the advantage of applying the encoding procedure for any kind of information words, e.g., data or control for uplink transmissions or downlink transmissions. It also allows improving the decoding performance by including cyclic redundancy check bits into the information word, or any other padding bits not used for carrying data or control information.

According to a second aspect of the application, the above mentioned and other objectives are achieved with a device for determining an information word $c = [c_0, c_1, \ldots, c_{K-1}]$, having K information bits, $c_i$. The device comprises a decoder comprising a tail biting convolutional code having a constraint length, L, where K<L−1. The decoder is configured to: receive an input sequence; compute at least one reliability parameter based on the received input sequence; and determine an information word c based on the at least one reliability parameter.

Advantages are provided by a device according to the second aspect as it allows reception of information words having K information bits encoded by a tail biting convolutional code having a constraint length, L, where K<L−1.

In a first possible implementation form of a device according to the second aspect, the decoder further is configured to compute the at least one reliability parameter based on the received input sequence and information comprising initial state of bit values and final state of bit values used in the encoding of the K information bits.

The first possible implementation form has an advantage in that the information about the initial state of bit values in the encoder could be utilized to improve the performance in the decoder.

In a second possible implementation form of a device according to the first possible implementation form of the second aspect, the information further comprises at least one bit in the initial state of bit values and the position of the at least one bit in the initial state of bit values.

The second possible implementation form has an advantage in that the information about the initial state of bit values in the encoder could be utilized to improve the performance in the decoder.

In a third possible implementation form of a device according to the first possible implementation form of the second aspect, the information further comprises that at least two bits in the initial state of bit values have the same value and that one of the two bits in the initial state of bit values is obtained from a cyclic extension of the information word c.

The third possible implementation form has an advantage in that the initial state of bit values could be utilized to improve the performance in a decoder.

According to a third aspect of the application, the above mentioned and other objectives are achieved with a method for encoding an information word $c=[c_0, c_1, \ldots, c_{K-1}]$ having K information bits, $c_i$, using a tail biting convolutional code having a constraint length, L, where K<L−1. The method comprises receiving the K information bits and encoding the K information bits so as to provide an encoded code word.

In a first possible implementation form of a method according to the third aspect, the encoder comprises an initial state of bit values and a final state of bit values used in the encoding of the K information bits, and wherein the initial state of bit values is the same the final state of bit values.

In a second possible implementation form of a method according to the first possible implementation form of the third aspect or to the third aspect as such, the method further comprises appending at least one bit to the information word c so as to obtaining an appended information word $c'=[c'_0, c'_1, \ldots, c'_{K'-1}]$ having K'≥L−1 bits, and using the appended information word c' as the initial state of bit values.

In a third possible implementation form of a method according to the second possible implementation form of the third aspect, the at least one appended bit has a predetermined value.

In a fourth possible implementation form of a method according to the third possible implementation form of the third aspect, the at least one appended bit has a predetermined fixed position.

In a fifth possible implementation form of a method according to the third or fourth possible implementation form of the third aspect, the method further comprises appending L−1−K fixed bits $f_0, f_1, \ldots, f_{L-2-K}$ according to $$c'_{\pi_k} = \begin{cases} c_k, & k=0, \ldots, K-1 \\ f_{k-K}, & k=K, \ldots, L-2 \end{cases}$$

where $\pi=[\pi_0, \ldots, \pi_{L-2}]$ is a permutation of integers $[0, \ldots, L-2]$.

In a sixth possible implementation form of a method according to any of the third to fifth possible implementation forms of the third aspect, the method further comprises inputting the appended information word c' to the encoder so as to encode the K information bits.

In a seventh possible implementation form of a method according to the second possible implementation form of the third aspect, the at least one appended bit is obtained from a cyclic extension of the information word c.

In an eighth possible implementation form of a method according to the seventh possible implementation form of the third aspect, the initial state of bit values are $$s_i = c_{(K-1-i) \bmod K}, \quad i=0, \ldots, L-1$$

where (K−1−i)mod K is smallest nonnegative integer that can be written as (K−1−i)+pK for an integer p.

In a ninth possible implementation form of a method according to the seventh or eighth possible implementation form of the third aspect, the method further comprises inputting the information word c to the encoder so as to encode the K information bits.

In a tenth possible implementation form of a method according to any of the first to ninth possible implementation form of the third aspect, the encoder comprises a shift register of length L−1, where K<L−1, for encoding the K information bits; and wherein the initial state of the bit values in the shift register (104), $s=[s_0, s_1, \ldots, s_{L-2}]$, is the same as the final state of the bit values in the shift register (104).

In a eleventh possible implementation form of a method according to any of the preceding possible implementation forms of the third aspect or to the third aspect as such, generator polynomials of the encoder are G0=133, G1=171 and G2=165 in octal representation, and wherein L=7.

In a twelfth possible implementation form of a method according to any of the preceding possible implementation forms of the third aspect or to the third aspect as such, the information word $c=[c_0, c_1, \ldots, c_{K-1}]$ is at least one of control information, data information, cyclic redundancy check bits, and padding bits.

According to a fourth aspect of the application, the above mentioned and other objectives are achieved with a method for determining an information word $c=[c_0, c_1, \ldots, c_{K-1}]$, having K information bits, $c_i$, using a decoder for a tail biting convolutional code having a constraint length, L, where K<L−1. The method comprises receiving an input sequence; computing at least one reliability parameter based on the received input sequence; and determining an information word c based on the at least one reliability parameter.

In a first possible implementation form of a method according to the fourth aspect, the method further comprises computing the at least one reliability parameter based on the received input sequence and information comprising initial state of bit values and final state of bit values used in the encoding of the K information bits.

In a second possible implementation form of a method according to the first possible implementation form of the fourth aspect, the information further comprises at least one bit in the initial state of bit values and the position of the at least one bit in the initial state of bit values.

In a third possible implementation form of a method according to the first possible implementation form of the fourth aspect, the information further comprises that at least two bits in the initial state of bit values have the same value and that one of the two bits in the initial state of bit values is obtained from a cyclic extension of the information word c.

The advantages of the methods according to the third and the fourth aspects are the same as those for the corresponding device for encoding and decoding according to the first and second aspects, respectively.

According to a fifth aspect of the application, the above mentioned and other objectives are achieved with a transmitter device for a wireless communication system, such as a user device or a base station, comprising at least one device for encoding according to an embodiment of the present application.

According to a sixth aspect of the application, the above mentioned and other objectives are achieved with a receiver device for a wireless communication system, such as a user device or a base station, comprising at least one device for determining an information word (i.e. a decoder) according to an embodiment of the present application.

The present application also relates to a computer program, characterized in code means, which when run by processing means causes said processing means to execute any method according to the present application. Further, the application also relates to a computer program product comprising a computer readable medium and said mentioned computer program, wherein said computer program is included in the computer readable medium, and comprises of one or more from the group: ROM (Read-Only Memory), PROM (Programmable ROM), EPROM (Erasable PROM), Flash memory, EEPROM (Electrically EPROM) and hard disk drive.

Further applications and advantages of the present application will be apparent from the following detailed description.

BRIEF DESCRIPTION OF THE DRAWINGS

The appended drawings are intended to clarify and explain different embodiments of the present application, in which.

DETAILED DESCRIPTION OF ILLUSTRATIVE EMBODIMENTS

Figure 1:
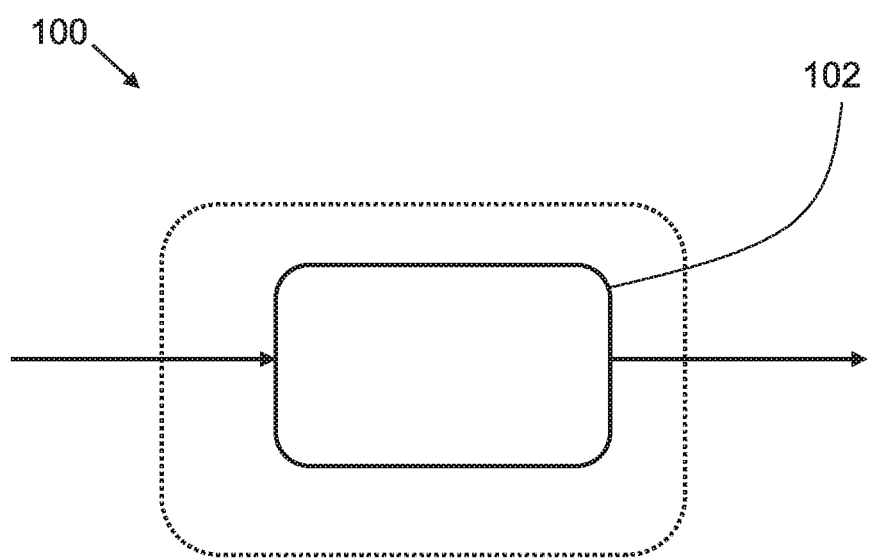
FIG. 1 shows a device for encoding (encoder device) according to an embodiment of the present application.

FIG. 1 shows a device 100 for encoding information words according to an embodiment of the present application. The device 100 comprises an encoder 102. The present device 100 is configured to encode one or more information words $c=[c_0, c_1, \ldots, c_{K-1}]$ having K information bits, $c_i$, by using an encoder 102 for a tail biting convolutional code having a constraint length L, where K<L−1. Therefore, the encoder 102 of the device 100 is configured to receive the K information bits of an information word as illustrated with the arrow pointing to the encoder 102 (note the encoder input is not shown in FIG. 1). The encoder 102 is further configured to encode the K information bits so as to provide an encoded code word. Further, the encoder 102 is configured to output the encoded code word which is illustrated with the arrow pointing away from the encoder 102.

Figure 2:
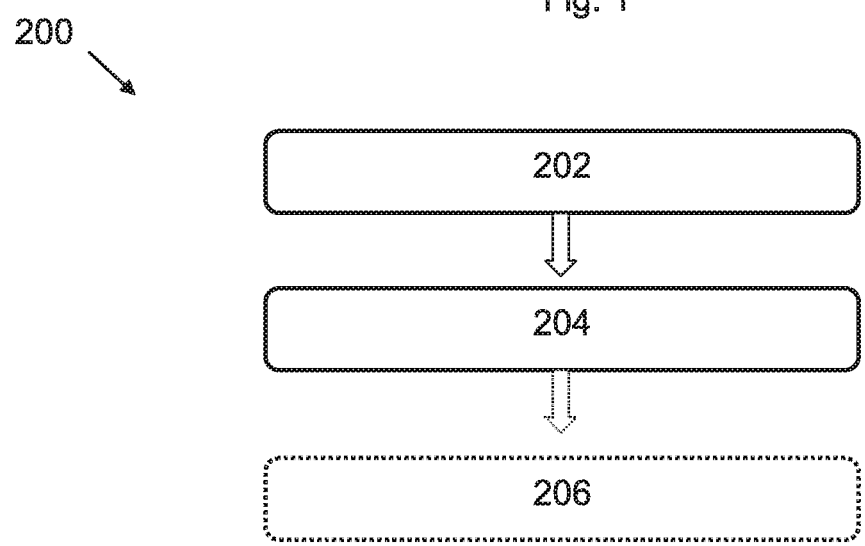
FIG. 2 shows a method according to an embodiment of the present application.

FIG. 2 shows a corresponding method which may be implemented in a device for encoding 100, such as the one shown in FIG. 1. The method 200 comprises the step of receiving 202 the K information bits. The method 200 further comprises the step of encoding 204 the K information bits so as to provide an encoded code word. The method 200 may also comprise the optional step of outputting 206 the encoded code word as illustrated with the dotted box in FIG. 2.

Furthermore, the information word $c=[c_0, c_1, \ldots, c_{K-1}]$ to be encoded is at least one of control information, data information, cyclic redundancy check bits, and padding bits. The information words for encoding may relate to different content. For example, data and/or control information for uplink transmissions or downlink transmissions in cellular communication systems, such as LTE. Further, the information word may also comprise cyclic redundancy check bits for improving the decoding performance. Also, other padding bits not used for carrying data or control information may be comprised in the information words.

According to an embodiment the encoder 102 comprises an initial state of bit values and a final state of bit values used in the encoding of the K information bits, and the initial state of bit values is the same the final state of bit values.

The present encoder 102 of the device 100 may be a software implementation, a hardware implementation, or a combination thereof.

In the case of a software implementation the encoding is performed by a processor (not shown in FIG. 1), such as a Digital Signal Processor (DSP). A digital signal processor may implement the encoder in different ways, since a convolutional code could be represented, e.g., as a linear filter, a set of difference equations or a generator matrix well known in the art.

In the case of a hardware implementation a shift register for convolutional codes may be used for encoding. Hence, in this embodiment the encoder 102 comprises a shift register 104 of length L−1, where K<L−1, for encoding the K information bits. The initial state of the bit values of the shift register 104, $s=[s_0, s_1, \ldots, s_{L-2}]$, is the same as the final state of the bit values in the shift register 104 as explained above.

Figure 3:
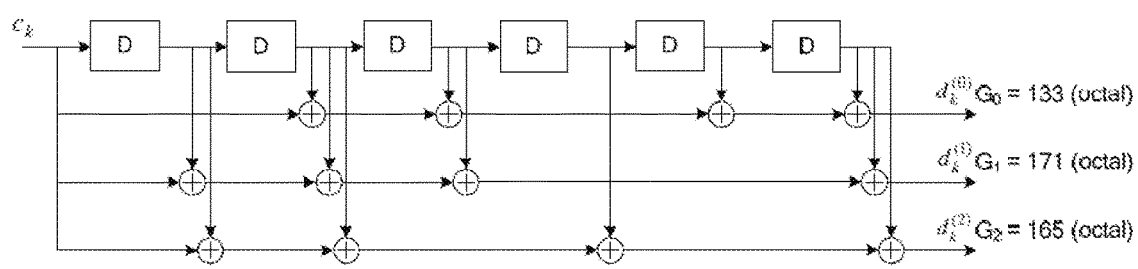
FIG. 3 shows a further embodiment of a device for encoding to the present application.

FIG. 3 shows an example of such a shift register 104 comprising inter-coupled delays and adders. The shift register 104 in the example in FIG. 3 uses the generator polynomials of LTE in octal representation but is not limited thereof. The information word $c=[c_0, c_1, \ldots, c_{K-1}]$ at the encoder 102 input consists of K bits. We denote the shift register of the encoder 102 by $s=[s_0, s_1, \ldots, s_{L-2}]$. Here, L is the constraint length of the encoder 102, which corresponds to the number of memory bits in the shift register plus 1. We have L=7 for the encoder 102 shown in FIG. 3. It is however realized that L may have another value.

The encoding procedure in FIG. 3 using the shift register 104 is defined as follows.

In the first step, the initial values of the shift register is set to $$s_i = c_{(K-1-i)}, \quad i=0, \ldots, L-2; \quad (1)$$

In the second step, the information word c is sent to the encoder 102 as encoder input which generates three encoded output streams $d_k^{(0)}$, $d_k^{(1)}$ and $d_k^{(2)}$, in this particular example. The total number of coded bit obtained after encoding is therefore N=3K and the rate of the code is $$R_c = \frac{K}{N} = 1/3.$$

Using the shift register initialization values defined in equation (1), only information words with length K≥L−1 bits can be encoded because, when the input word has K<L−1 bits, the shift register initial values $s_K, \ldots, s_{L-2}$ are not defined.

A solution is to extend the information word c with additional appended bits until the minimum length L−1 bits is reached, and then send the appended word to the encoder 102 input. This solution has the advantage of being simple to implement. However, the number of coded bits obtained after encoding would be 3 (L−1) independently of the value of K, therefore the code rate would be $$R_c = \frac{K}{3(L-1)} < 1/3.$$

Therefore, in the following embodiments of the present application the encoder 102 is further configured to append at least one bit to the information word c so as to obtaining an appended information word $c'=[c'_0, c'_1, \ldots, c'_{K'-1}]$ having K'≥L−1 bits. Further, the encoder 102 is configured to using the appended information word c' as the initial state of bit values for the encoding of the information word c.

According to an approach corresponding to an embodiment, K<L−1 information bits are available at the encoder 102 input and at least one appended bit has a predetermined value and possibly a fixed position.

In the first step the information word c is appended (padded) with L−1−K fixed bits $f_0, \ldots, f_{L-2-K}$ (e.g., $f_0= \ldots =f_{L-2-K}=0$) so as to obtain an appended information word $c'=[c'_0, c'_1, \ldots, c'_{L-2}]$ using $$c'_{\pi_k} = \begin{cases} c_k, & k=0, \ldots, K-1 \\ f_{k-K}, & k=K, \ldots, L-2 \end{cases} \quad (2)$$

where $\pi=[\pi_0, \ldots, \pi_{L-2}]$ is a permutation of integers [0, ..., L−2].

In a second step, the L−1 bits in the appended information word c' are used to set the initial value of the shift register according to equation (1).

In a third step, the appended information word c' is sent as input to the encoder 102 and three encoded output streams $d_k^{(0)}, d_k^{(1)}$ and $d_k^{(2)}$ are generated in this particular example.

Figure 4:
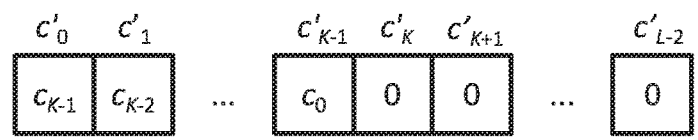
FIG. 4 shows an appended control information word.

FIG. 4 shows the appended information word according to this embodiment with the fixed bits $f_0= \ldots =f_{L-2-K}=0$ and where π=[0, 1, ..., L−2]. The device 100 is here configured to input the appended information word c' to the encoder 102 so as to encode the K information bits according to this embodiment.

These embodiments have the advantages of providing a simple way to use the existing encoder 102 also when K<L−1 control information bits are available at the encoder 102 input. Therefore, the same encoder 102 could be used as for K≥L−1. Moreover, it has the advantage that the fixed bits and their positions are known at the encoder 102 and decoder 302 (see FIG. 6), thereby allowing the receiver to exploit their knowledge to improve the reliability of transmission.

An alternative solution to appending with fixed bit values is to initialize the encoder 102 of length L−1 using the K<L−1 input bits of the information word in a way that, after encoding the K<L−1 input bits, the encoder 102 has the same state as the initial state, thereby resulting in a tail-biting codeword. In this way, N=3K coded bits would be obtained and the resulting code rate would be $R_c=1/3$. This solution is detailed in the following.

According to this embodiment, K<L−1 information bits are available at the encoder 102 input.

In a first step, the shift register is initialized as $$s_i = c_{(K-1-i) \bmod K}, \; i=0, \ldots, L-1. \quad (3)$$

where (K−1−i)mod K is the remainder of (K−1−i)/K.

In a second step, the K information bits are sent to the encoder 102 and three encoded output streams $d_k^{(0)}, d_k^{(1)}$ and $d_k^{(2)}$ are generated in this particular example.

Figure 5:
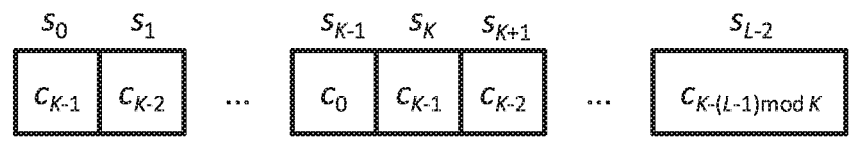
FIG. 5 shows another appended control information word.

FIG. 5 shows the shift register initialization proposed in this embodiment according to equation (3). The device 100 is further is configured to input the information word c to the encoder 102 so as to encode the K information bits according to this embodiment.

This embodiment has the advantage of providing a way to initialize the shift register 104 of length L−1 when K<L−1 information bits are available at the encoder 102 input. Moreover, it has the advantage that, after the K<L−1 information bits have been processed by the encoder 102, the final encoder state coincides with the initial state defined in equation (2), thereby resulting in a valid codeword of the tail-biting convolutional code. Therefore, a standard tail-biting decoder can be used at the receiver as. Furthermore, with this embodiment encoding short information words yields the same code rate as encoding long information words.

A decoder 302 corresponding to the encoder 102 of the previous embodiments would utilize knowledge of the structure of the tail biting convolutional code (e.g., the generator polynomials, the number of information bits) in the decoding. The decoder 302 takes an input sequence and applies a decoding algorithm on the input sequence. The input sequence may consist of bits (e.g., used for hard decoding) or log-likelihood ratios (e.g., used for soft decoding). The input sequence can comprise a codeword from the encoder 102. However, the decoder 302 can produce an information word for any input sequence and may not need to assume that the input sequence comprises a codeword.

The disclosed application is applicable to different kinds of decoding algorithms. For example, maximum likelihood decoding could be achieved by using the Viterbi algorithm, while maximum aposteriori decoding could be utilized by using the Bahl-Cocke-Jelinek-Raviv (BCJR) algorithm. In both cases, the decoding algorithm, would assume that the initial state of the encoder was the same as the final state of the encoder 102 and based on some reliability measure or parameter, the decoding algorithm will determine the most probable codeword or information word, based on this constraint. Reliability parameters (or measures) could include a Hamming distance, a log-likelihood ratio, or the like, which is well known in the art.

Figure 6:
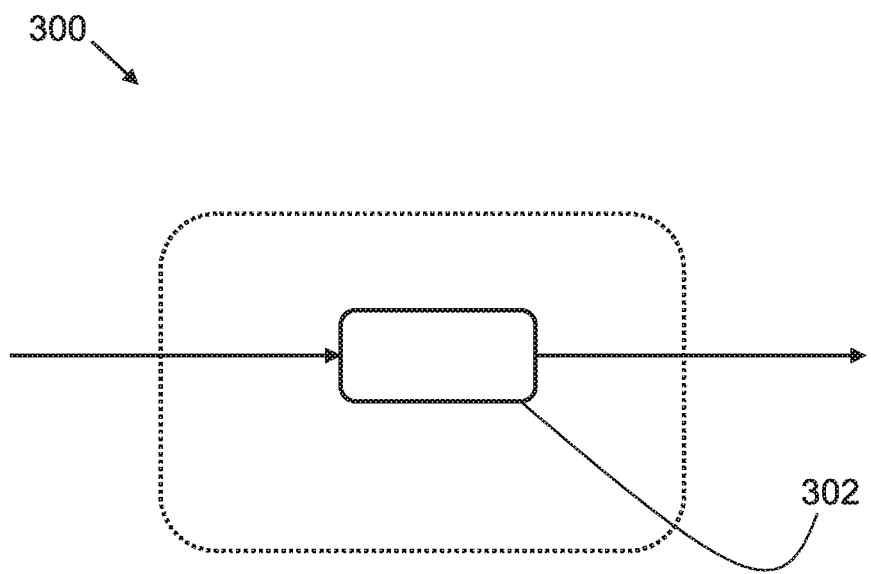
FIG. 6 shows a device for determining an information word (decoder device) according to an embodiment of the present application.

FIG. 6 shows a device 300 for determining an information word (decoder device) according to an embodiment of the present application. The device 300 is configured to determine an information word $c=[c_0, c_1, \ldots, c_{K-1}]$, having K information bits, $c_i$, corresponding to the encoding at the encoder 102. The device 300 comprising a decoder 302 for a tail biting convolutional code having a constraint length, L, and where K<L−1. The decoder 302 is configured to receive an input sequence illustrated with the rightwards directed arrow to the decoder 302. The decoder 302 is further configured compute at least one reliability parameter based on the received input sequence. Finally, the decoder 302 is configured to determine an information word c based on the at least one reliability parameter.

Figure 7:
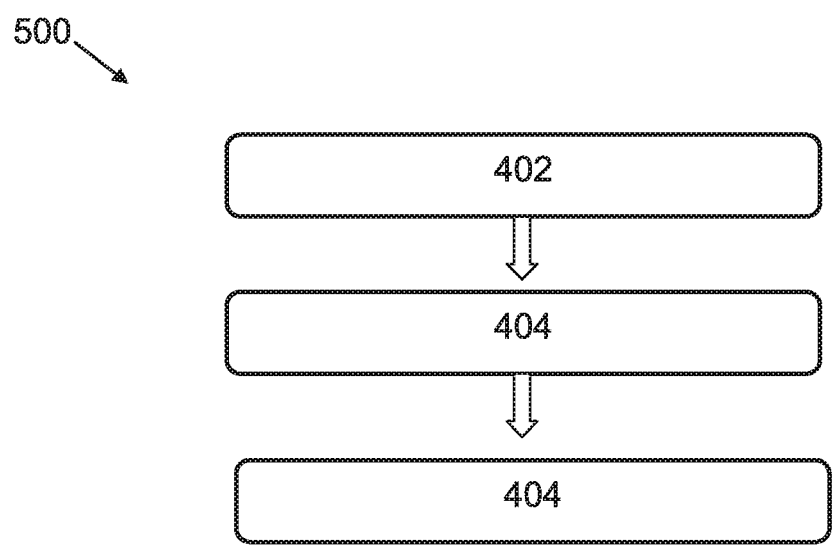
FIG. 7 shows another method according to an embodiment of the present application.

FIG. 7 shows a corresponding method which may be implemented in a device 300 for decoding, such as the one shown in FIG. 6. The method 400 comprises the step of receiving 402 an input sequence. The method 400 further comprises the step of computing 404 at least one reliability parameter based on the received input sequence. The method 400 finally comprises the step of determining 406 an information word c based on the at least one reliability parameter.

In an embodiment the decoder 302 is further configured to compute the at least one reliability parameter based on the received input sequence and on information comprising initial state of bit values and final state of bit values used in the encoding of the K information bits at the encoder 102. Such information could be pre-determined (e.g., rules could be defined on how the encoder is setting the initial state of the bit values, i.e., how the appended information word is generated) or be signalled to the decoder. By using information about the initial state of bit values and final state of bit values improved decoding performance is provided.

In a further embodiment for improved decoding performance the information used for computing the at least one reliability parameter further comprises at least one bit in the initial state of bit values and the position of the at least one bit in the initial state of bit values. This embodiment relates to the case when the encoding has been performed with an appended code word c' in which at least one appended bit has a predetermined value. For example if N of the bits in the initial state of the shift register $s_i$, i=0, . . . , L−1 are known (i.e., their values and positions), the number of states could be reduced from $2^L$ to $2^N$. This reduces the search space for the decoding algorithm and eliminates a number of false candidate states, which improves the decoding performance.

In an alternative of the embodiment for improved decoding performance the information used for computing the at least one reliability parameter further comprises that at least two bits in the initial state of bit values have the same value and that one of the two bits in the initial state of bit values is obtained from a cyclic extension of the information word c. This embodiment relates to the case when the encoding has been performed with an appended code word c' in which the at least one appended bit is obtained from a cyclic extension of the information word c. For example if N of the bits in the initial state of the shift register $s_i$, i=0, . . . , L−1 are obtained from a cyclic extension of the information word, the last N bits in the shift register are the same as the first N bits in the shift register. Hence, the number of states could be reduced from $2^L$ to $2^N$. This reduces the search space for the decoding algorithm and eliminates a number of false candidate states, which improves the decoding performance.

Figure 8:
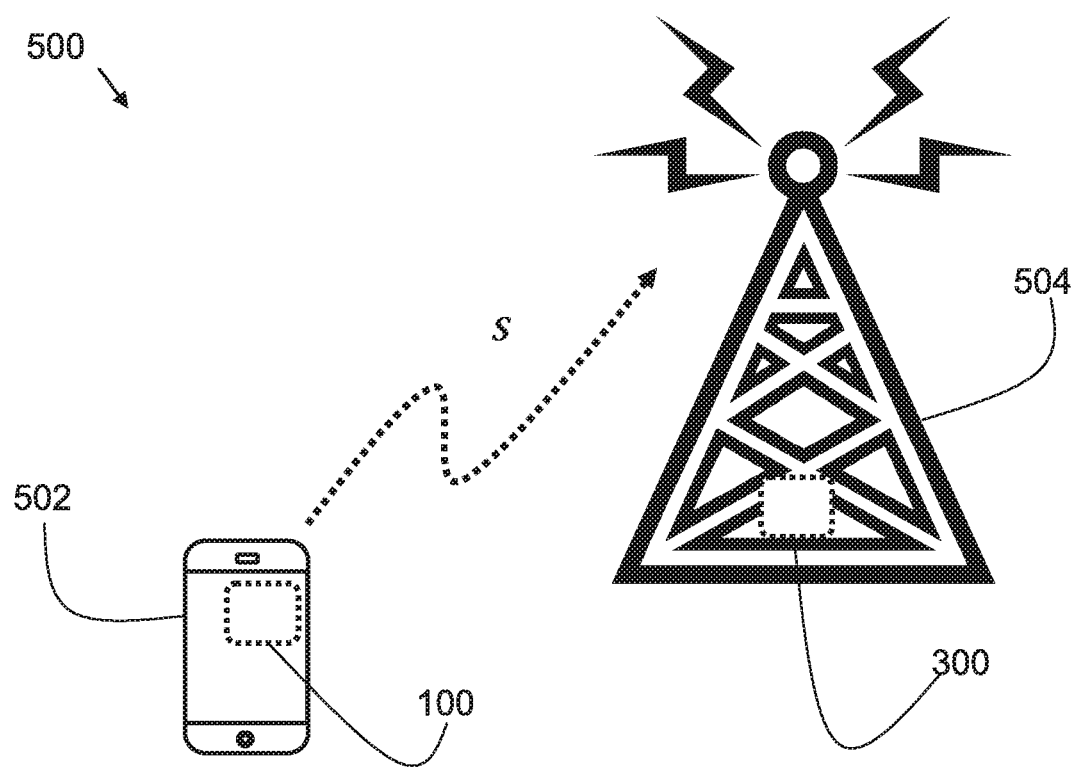
FIG. 8 shows a wireless communication system according to an embodiment of the present application.

FIG. 8 shows a wireless communication system 500, such as LTE, according to an embodiment of the present application. A user device 502 (the transmitter device in this example) comprises a device 100 for encoding according to embodiments of the present application. Information words c are encoded by the device 100 for encoding. The encoded word is thereafter signal processed in the user device 502, such as modulation, amplification, etc., and transmitted in a communication signal S in an uplink channel in the wireless communication system 500 to a base station 504 (the receiver device in this example) as illustrated in FIG. 8. The base station 504 comprises a decoder device 300 according to embodiments of the present application. The base station 504 receives the communication signal in the uplink channel. After suitable signal pre-processing an input sequence is provided to the decoder device 300 which decodes the input sequence as explained previously.

It is to be noted that the user device 502 may also comprise a device 300 for decoding. The base station 504 may also comprise a device for encoding 100.

The present transmitter or receiver in the form of a user device 502 discussed in the present disclosure may be any of a User Equipment (UE), mobile station (MS), wireless terminal or mobile terminal which is enabled to communicate wirelessly in a wireless communication system, sometimes also referred to as a cellular radio system. The UE may further be referred to as mobile telephones, cellular telephones, computer tablets or laptops with wireless capability. The UEs in the present context may be, for example, portable, pocket-storable, hand-held, computer-comprised, or vehicle-mounted mobile devices, enabled to communicate voice or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM).

The present transmitter or receiver in the form of a base station 504 may be a (radio) network node or an access node or an access point or a base station, e.g., a Radio Base Station (RBS), which in some networks may be referred to as transmitter, "eNB", "eNodeB", "NodeB" or "B node", depending on the technology and terminology used. The radio network nodes may be of different classes such as, e.g., macro eNodeB, home eNodeB or pico base station, based on transmission power and thereby also cell size. The radio network node can be a Station (STA), which is any device that contains an IEEE 802.11-conformant Media Access Control (MAC) and Physical Layer (PHY) interface to the Wireless Medium (WM).

Furthermore, any method 200 or 400 according to embodiments of the present application may be implemented in a computer program, having code means, which when run by processing means causes the processing means to execute the steps of the method. The computer program is included in a computer readable medium of a computer program product. The computer readable medium may comprises of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Moreover, it is realized by the skilled person that the user device and base station comprise the necessary communication capabilities in the form of e.g., functions, means, units, elements, etc., for performing the present solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the present solution.

Especially, the processors of the present user device and base station may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the present application is not limited to the embodiments described above, but also relates to and incorporates all embodiments within the scope of the appended independent claims.

What is claimed is:

1. A device, comprising:
an encoder comprising a tail biting convolutional code having a constraint length, wherein L represents a length of the constraint length of the tail biting convolutional code, the encoder being configured to:
receive K information bits $c_i$ of an information word $c=[c_0, c_1, \ldots, c_{K-1}]$, wherein K represents a number of information bits $c_i$ received, K is less than L minus one; and
encode the K information bits to provide an encoded code word using the tail biting convolutional code.

2. The device according to claim 1, wherein the encoder comprises an initial state of bit values and a final state of bit values for encoding of the K information bits, and wherein the initial state of bit values is the same the final state of bit values.

3. The device according to claim 2, wherein the encoder further is configured to:
append at least one bit to the information word c to obtain an appended information word c' having K' information bits, wherein $c'=[c'_0, c'_1, \ldots, c'_{K'-1}]$ and K'≥L−1; and
use the appended information word c' as the initial state of bit values.

4. The device according to claim 3, wherein the at least one appended bit has a predetermined value.

5. The device according to claim 3, wherein the encoder further is configured to append L−1−K fixed bits, $f_0, \ldots, f_{L-2-K}$, to the information word c to obtain the appended information word c' according to:

$$c'_{\pi_k} = \begin{cases} c_k, & k=0, \ldots, K-1 \\ f_{k-K}, & k=K, \ldots, L-2 \end{cases}$$

where $\pi=[\pi_0, \ldots, \pi_{L-2}]$ is a permutation of integers $[0, \ldots, L-2]$.

6. The device according to claim 3, wherein the device is configured to:
input the appended information word c' to the encoder to encode the K information bits.

7. The device according to claim 3, wherein the at least one appended bit is obtained from a cyclic extension of the information word c.

8. The device according to claim 7, wherein the initial state of bit values are:

$$s_i = c_{(K-1-i) \bmod K}, \ i=0, \ldots, L-1$$

where (K−1−i)mod K is the smallest non-negative integer that can be expressed as (K−1−i)+pK for an integer p.

9. The device according to claim 7, wherein the device further is configured to:
input the information word c to the encoder to encode the K information bits.

10. The device according to claim 2, wherein the encoder comprises a shift register of length L−1 for encoding the K information bits, and wherein the initial state of the bit values in the shift register $s=[s_0, s_1, \ldots, s_{L-2}]$, is the same as the final state of the bit values in the shift register.

11. A device, comprising:
a decoder comprising a tail biting convolutional code having a constraint length, wherein L represents a length of the constraint length of the tail biting convolutional code, the decoder being configured to:
receive an input sequence;
compute at least one reliability parameter based on the received input sequence; and
determine an information word c using the tail biting convolutional code and based on the at least one reliability parameter, wherein the information word $c=[c_0, c_1, \ldots, c_{K-1}]$ has K information bits $c_i$, wherein K represents a number of information bits $c_i$, K is less than L minus 1.

12. The device according to claim 11, wherein the decoder further is configured to compute the at least one reliability parameter based on:
the received input sequence; and
information comprising an initial state of bit values and a final state of bit values used in encoding the K information bits.

13. A method comprising:
receiving, by an encoder, K information bits $c_i$ of an information word $c=[c_0, c_1, \ldots, c_{K-1}]$, wherein K represents a number of information bits $c_i$ received; and
encoding, by the encoder, the K information bits using a tail biting convolutional code to provide an encoded code word, wherein the tail biting convolutional code has a constraint length, L represents a length of the constraint length of the tail biting convolutional code, and K is less than L minus one.

14. The method according to claim 13, further comprising:
appending at least one bit to the information word c to obtain an appended information word $c'=[c'_0, c'_1, \ldots, c'_{K'-1}]$ having K'≥L−1 bits; and
using the appended information word c' as an initial state of bit values to encode the K information bits.

15. The method according to claim 14, wherein the at least one appended bit has a predetermined value.

16. The method according to claim 14, wherein the at least one appended bit is obtained from a cyclic extension of the information word c.

17. The method according to claim 16, wherein the initial state of bit values are:

$$s_i = c_{(K-1-i) \bmod K}, \ i=0, \ldots, L-1$$

where (K−1−i)mod K is the smallest non-negative integer that can be expressed as (K−1−i)+pK for an integer p.

18. A method, comprising:
receiving, by a decoder, an input sequence;
computing, by the decoder, at least one reliability parameter based on the received input sequence; and
determining, by the decoder, an information word $c=[c_0, c_1, \ldots, c_{K-1}]$ using a tail biting convolutional code and based on the at least one reliability parameter, wherein the information word c has K information bits $c_i$, K is a number of information bits $c_i$, the tail biting convolutional code has a constraint length, L represents a length of the constraint length of the tail biting convolutional code, and K is less than L minus one.

19. The method according to claim 18 further comprising:
computing the at least one reliability parameter based on the received input sequence and information comprising an initial state of bit values and a final state of bit values used in encoding the K information bits.

* * * * *